United States Patent
Shur et al.

(10) Patent No.: US 9,455,040 B2
(45) Date of Patent: *Sep. 27, 2016

(54) MITIGATING RELIABILITY DEGRADATION OF ANALOG MEMORY CELLS DURING LONG STATIC AND ERASED STATE RETENTION

(71) Applicant: Apple Inc., Cupertino, CA (US)

(72) Inventors: Yael Shur, Tel Aviv (IL); Yoav Kasorla, Kfar Netar (IL); Moshe Neerman, Hadera (IL); Naftali Sommer, Rishon Le-Zion (IL); Avraham Poza Meir, Rishon Le-Zion (IL); Etai Zaltsman, Ramat-Hasaron (IL); Eyal Gurgi, Petah-Tikva (IL); Meir Dalal, Rishon Lezion (IL)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/962,333

(22) Filed: Dec. 8, 2015

(65) Prior Publication Data

US 2016/0093386 A1    Mar. 31, 2016

Related U.S. Application Data

(63) Continuation of application No. 14/249,448, filed on Apr. 10, 2014, now Pat. No. 9,236,132.

(60) Provisional application No. 61/830,689, filed on Jun. 4, 2013, provisional application No. 61/886,274, filed on Oct. 3, 2013.

(51) Int. Cl.
| | | |
|---|---|---|
| G11C 16/14 | (2006.01) | |
| G11C 16/16 | (2006.01) | |
| G11C 11/56 | (2006.01) | |
| G11C 16/04 | (2006.01) | |
| G11C 16/34 | (2006.01) | |

(52) U.S. Cl.
CPC .......... *G11C 16/14* (2013.01); *G11C 11/5628* (2013.01); *G11C 16/0483* (2013.01); *G11C 16/16* (2013.01); *G11C 16/349* (2013.01); *G11C 16/3418* (2013.01)

(58) Field of Classification Search
None
See application file for complete search history.

(56) References Cited

U.S. PATENT DOCUMENTS

| | | | |
|---|---|---|---|
| 5,424,991 A | 6/1995 | Hu | |
| 5,530,675 A | 6/1996 | Hu | |
| 6,169,691 B1 | 1/2001 | Pasotti | |
| 6,246,610 B1 | 6/2001 | Han | |
| 6,483,751 B2 | 11/2002 | Chen | |
| 7,292,473 B2 | 11/2007 | Niset | |
| 7,889,562 B2 | 2/2011 | Nobunaga | |
| 8,264,890 B2 | 9/2012 | Moklesi | |
| 8,804,436 B1 | 8/2014 | Chan | |
| 2010/0074006 A1 | 3/2010 | Parker | |
| 2010/0277983 A1* | 11/2010 | Mokhlesi | G11C 11/5635 365/185.17 |

* cited by examiner

*Primary Examiner* — James G Norman
(74) *Attorney, Agent, or Firm* — Meyertons, Hood, Kivlin, Kowert & Goetzel, P.C.

(57) ABSTRACT

A method in a non-volatile memory, which includes multiple memory cells that store data using a predefined set of programming levels including an erased level, includes receiving a storage operation indicating a group of the memory cells that are to be retained without programming for a long time period. The memory cells in the group are set to a retention programming level that is different from the erased level. Upon preparing to program the group of memory cells with data, the group of memory cells is erased to the erased level and the data is then programmed in the group of memory cells.

20 Claims, 3 Drawing Sheets

MITIGATING RELIABILITY DEGRADATION OF ANALOG MEMORY CELLS DURING LONG STATIC AND ERASED STATE RETENTION

CROSS-REFERENCE TO RELATED APPLICATIONS

This application is a continuation application of U.S. patent application Ser. No. 14/249,448, entitled "TECHNIQUES FOR MITIGATING RELIABILITY DEGRADATION OF ANALOG MEMORY CELLS DURING ERASED STATE RETENTION", filed Apr. 10, 2014, which claims the benefit of U.S. Provisional Patent Application 61/830,689, filed Jun. 4, 2013, and U.S. Provisional Patent Application 61/886,274, filed Oct. 3, 2013, whose disclosures are both incorporated herein by reference.

TECHNICAL FIELD

The embodiments disclosed herein relate generally to memory devices, and particularly to methods and systems for reducing reliability degradation in analog memory cells.

BACKGROUND

The reliability of analog memory cells, such as Flash cells, typically deteriorates with usage. In some cases, however, it is possible to rejuvenate analog memory cells, e.g., by retaining them in a programmed state for a certain time period and/or by heating the memory cells. Rejuvenation techniques for analog memory cells are known in the art. For example, U.S. Pat. No. 8,248,831, whose disclosure is incorporated herein by reference describes a method for data storage in a memory that includes multiple analog memory cells fabricated using respective physical media. The method includes identifying a group of the memory cells whose physical media have deteriorated over time below a given storage quality level. A rejuvenation process, which causes the physical media of the memory cells in the group to meet the given storage quality level, is applied to the identified group. Data is stored in the rejuvenated group of the memory cells.

SUMMARY

An embodiment provides a method including receiving, in a non-volatile memory that includes multiple memory cells that store data using a predefined set of programming levels, including an erased level, a storage operation indicating a group of the memory cells that are to be retained without programming for a long time period. The memory cells in the group are set to a retention programming level that is different from the erased level. Upon preparing to program the group of memory cells with data, the group of memory cells is erased to the erased level and the data is then programmed in the group of memory cells.

In some embodiments, the retention programming level is higher than each of the programming levels in the predefined set of programming levels. In other embodiments, setting the memory cells to the retention programming level includes retaining the group of memory cells at their present programming levels. In yet other embodiments, the method further includes managing a retention pool of memory cell blocks that are programmed to the retention programming level, and upon receiving the data for storage, selecting the group of memory cells from the memory cell blocks in the retention pool.

In an embodiment, the method includes managing an erased pool of memory cell blocks whose cells are erased to the erased level, and selecting the group of memory cells includes selecting a block from the erased pool when available.

There is additionally provided, in accordance with an embodiment, apparatus for data storage, including a non-volatile memory and storage circuitry. The non-volatile memory includes multiple memory cells that store data using a predefined set of programming levels, including an erased level. The storage circuitry is configured to receive a storage operation indicating a group of the memory cells that are to be retained without programming for a long time period, to set the memory cells in the group to a retention programming level that is different from the erased level, and upon preparing to program the group of memory cells with data, to erase the group of memory cells to the erased level and then to program the data in the group of memory cells.

There is additionally provided, in accordance with an embodiment, a method including receiving, in a non-volatile memory that includes multiple memory cells, a storage operation to be applied to the memory cells. Upon detecting that the memory cells have been retained in an erased level for a duration longer than a predefined time period, a preliminary storage operation is performed on the memory cells, and only then the storage operation is applied to the memory cells.

In some embodiments, receiving the storage operation includes receiving a programming operation with data for storage, performing the preliminary storage operation includes applying one or more dummy erasure and program (E/P) cycles to the memory cells, and applying the storage operation includes programming the received data to the memory cells. In other embodiments, receiving the storage operation includes receiving an erasure operation, performing the preliminary storage operation includes programming at least some of the memory cells to a predefined level, and applying the storage operation includes erasing the memory cells. In yet other embodiments, receiving the storage operation includes receiving a programming operation with data for storage, performing the preliminary storage operation includes programming a group of the memory cells to a predefined level, and applying the storage operation includes programming the received data to the group of memory cells.

There is additionally provided, in accordance with an embodiment, apparatus for data storage, including a non-volatile memory, which includes multiple memory cells, and storage circuitry. The storage circuitry is configured to receive a storage operation to be applied to the memory cells, and, upon detecting that the memory cells have been retained in an erased level for a duration longer than a predefined time period, to perform a preliminary storage operation on the memory cells, and only then to apply the storage operation to the memory cells.

There is additionally provided, in accordance with an embodiment, a method including receiving data to be written to a group of analog memory cells in a non-volatile memory in which first data values are mapped to a first programming level corresponding to a first range of analog storage values, and second data values are mapped to a second programming level corresponding to a second range of analog storage values, higher than the first range. The received data is scrambled non-uniformly, so as to produce a first number of the first data values and a second number of the second data values, larger than the first number. The non-uniformly-scrambled data is stored in the group of the memory cells.

There is additionally provided, in accordance with an embodiment, apparatus for data storage, including a non-volatile memory, which includes multiple analog memory cells, and storage circuitry. The storage circuitry is configured to receive data to be written to a group of the analog memory cells in which first data values are mapped to a first programming level corresponding to a first range of analog storage values, and second data values are mapped to a second programming level corresponding to a second range of analog storage values, higher than the first range, to scramble the received data non-uniformly so as to produce a first number of the first data values and a second number of the second data values, larger than the first number, and to store the non-uniformly-scrambled data in the group of the memory cells.

The embodiments disclosed herein will be more fully understood from the following detailed description of the embodiments thereof, taken together with the drawings in which:

DETAILED DESCRIPTION OF EMBODIMENTS

Overview

Figure 1:
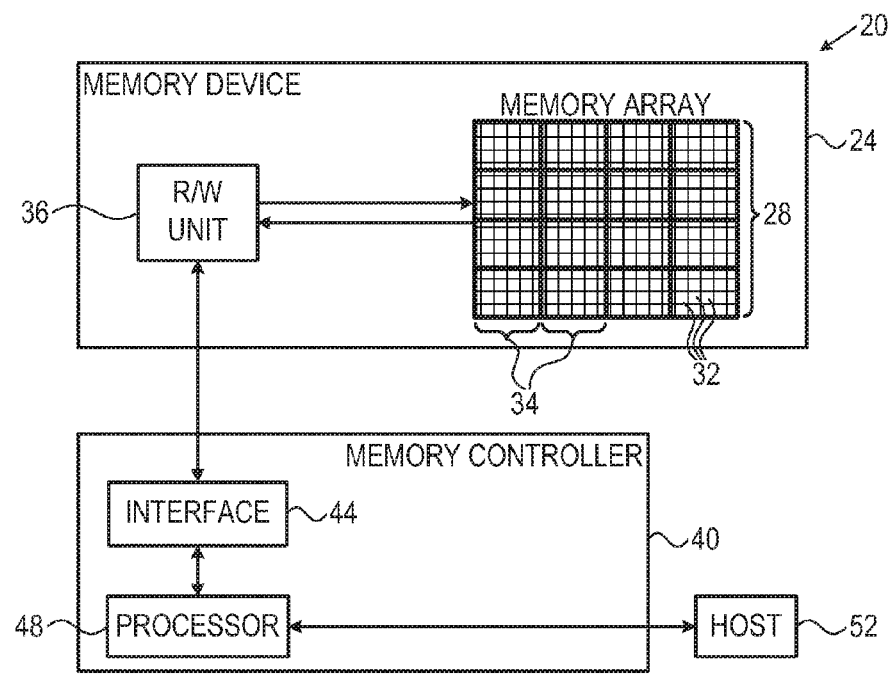
FIG. 1 is a block diagram that schematically illustrates a memory system, in accordance with an embodiment.

Various factors may reduce the reliability of non-volatile memory cells such as Flash memory cells. Such factors include, for example, drift of the programming levels of the stored data, and wear out due to repetitive application of erasure and programming operations.

As yet another factor, the inventors have found that retaining analog memory cells for prolonged time periods in an erased state causes degradation of the memory cell reliability. More generally, reliability degradation will typically be experienced in memory cells whose threshold voltage $V_T$ is below some threshold $V_T$, e.g., the natural $V_T$ of the cells. The actual threshold voltage below which reliability degradation is noticeable may depend, for example, on the technology and/or process of the memory device, and may vary among the memory cells.

Thus, in the context of the present patent application and in the claims, the terms "erased cells," "erased level" and "erased state" refer to memory cells that are susceptible to the above-described degradation because their $V_T$ is below some threshold $V_T$. Erased cells may belong to memory blocks whose entire cells are erased or to blocks that are partially programmed.

Embodiments that are described herein provide methods and systems for mitigating reliability degradation in analog memory cells. Some of the disclosed techniques avoid, or at least significantly reduce, retention of analog memory cells in an erased state for long periods of time.

In some embodiments, when a group of memory cells (e.g., an erasure block) is to be retained without programming for a long time period, the memory cells in the group are first programmed to some programming level, also referred to as a retention state, and the memory cells are then retained at the retention state instead of at the erased state. Alternatively, the memory cells in the group are left programmed with the data they already store and erased only immediately before they are needed for storing new data. As a result, the above-described degradation mechanism is mitigated.

In some embodiments, programming a group of memory cells to the retention state is applied as part of various system management operations, such as, for example, as part of garbage collection. The memory system holds a pool of blocks in the retention state, e.g., blocks from which valid data was copied to other blocks. Additionally, the memory system may hold another pool of erased blocks that are erased and ready for immediate programming. Memory blocks that remain in the erased pool for a predefined period of time, are typically added to the retention pool.

In other disclosed techniques, a preliminary storage operation is applied to cells that have been retained in the erased state for a long time period. In an embodiment, when new data is about to be programmed to a group of memory cells that have been retained in the erased state for a long time period, a sequence of one or more dummy erasure and program (E/P) cycles is applied to the group of memory cells prior to programming the new data. If the group of memory cells resides in a memory block that also stored valid data, the valid data is typically copied to an alternative location before performing the dummy E/P cycles, and optionally copied back afterwards.

In another embodiment, the operation of erasing a memory block comprises an additional preliminary phase in which some or all of the block's memory cells are programmed to a predefined level. Then, the block is conventionally erased.

In yet another embodiment, the operation of data programming comprises a preliminary phase in which the cells to be programmed are initially programmed to a predefined level. When programming a least significant bit (LSB) page, all the cells of the page are so preliminarily programmed. When programming a higher significant bit page, e.g., a most significant bit (MSB) page, only cells that are in the erased state are subject to the preliminary programming operation.

The disclosed techniques can be implemented, for example, by introducing new commands or modifying existing commands in the interface between a memory controller and the memory devices it controls.

In alternative embodiments, the data for storage is scrambled non-uniformly, so that the relative share of the cells that are programmed to higher programming levels increases. Since cells programmed to higher programming levels typically store future-programmed data with higher reliability, the average storage reliability increases accordingly.

By using the disclosed techniques, the above-described degradation mechanisms are reduced or even possibly eliminated. The methods and systems described herein thus improve the reliability and lifetime of analog memory cells.

System Description

FIG. 1 below is a block diagram that schematically illustrates a memory system 20, in accordance with an embodiment. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device. Memory controller 40, and in particular processor 48, may be implemented in hardware. Alternatively, the memory controller may comprise a microprocessor that runs suitable software, or a combination of hardware and software elements.

The disclosed techniques can be carried out by memory controller 40, by R/W unit 36, or both. Thus, in the context of disclosed embodiments and in the claims, memory controller 40 and R/W unit 36 are referred to collectively as storage circuitry that carries out the disclosed techniques.

The configuration of FIG. 1 is an exemplary system configuration, which is shown purely for the sake of conceptual clarity. Any other suitable memory system configuration can also be used. Elements that are not necessary for understanding the principles of the disclosed embodiments, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^7$ memory cells, whereas a page is on the order of $10^4$-$10^5$ memory cells.

Degradation of Cell Reliability Due to Prolonged Retention in Erased State

Typically, R/W unit 36 in memory device 24 stores data in a group of memory cells 32 by programming the memory cells to assume certain threshold voltages (or other analog values) that represent the data. One of the states also serves as an erased state.

Figure 2:
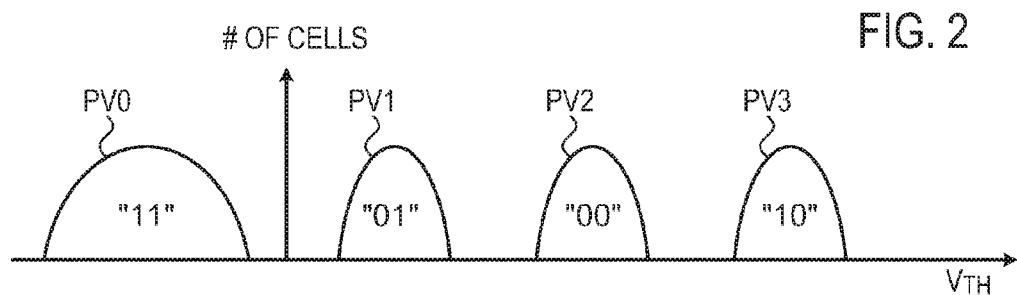
FIGS. 2 and 3 are graphs that schematically illustrate threshold voltage distributions in a group of memory cells, in accordance with various embodiments.

FIG. 2 is a graph that schematically illustrates threshold voltage distributions in a group of memory cells 32, in accordance with an embodiment. In the present example, the threshold voltages in the group of memory cells 32 are distributed in four programming state distributions PV0 ... PV3, each representing a two-bit data value. The left-most "11" programming state PV0 also serves as an erased state. Note that in the present example, erased state PV0 corresponds to negative threshold voltage, whereas the other programming states PV1 ... PV3 correspond to ranges of positive threshold voltages. Generally, however, any of PV0 ... PV3 may correspond to positive or negative threshold voltages.

In various scenarios, a group of memory cells may remain in the erased state for long periods of time, for example when a memory block 34 is erased and waiting for new data to be written, or when a memory device 24 is shipped from the factory with all its memory cells in the erased state. As another example, when a memory block 34 is partially programmed, cells of the block that are not yet programmed may remain in the erased state for prolonged time periods before the cells are programmed.

The inventors have discovered that retaining memory cells 32 in the erased state for long time periods causes degradation in the reliability of the memory cells. More generally, reliability degradation will typically be experienced by memory cells whose threshold voltage $V_T$ is below a certain value, such as, for example, below the natural $V_T$ of the cells. The actual $V_T$ value below which reliability degradation is noticeable may depend, for example, on the technology and/or process of the memory device, and may vary among the memory cells. This reliability degradation can be observed, for example, by measuring a relatively fast drift of the cell threshold voltage after programming operation, or by observing a relatively high read error probability when storing data in the memory cells.

Techniques for Mitigating Reliability Degradation Using a Dedicated Programming State In various embodiments, system 20 employs different techniques for mitigating the above-described degradation in memory cell reliability. In some embodiments, system 20 retains erased memory cells in a dedicated programming state denoted PV*, until immediately before the cells are to be programmed with data.

Figure 3:
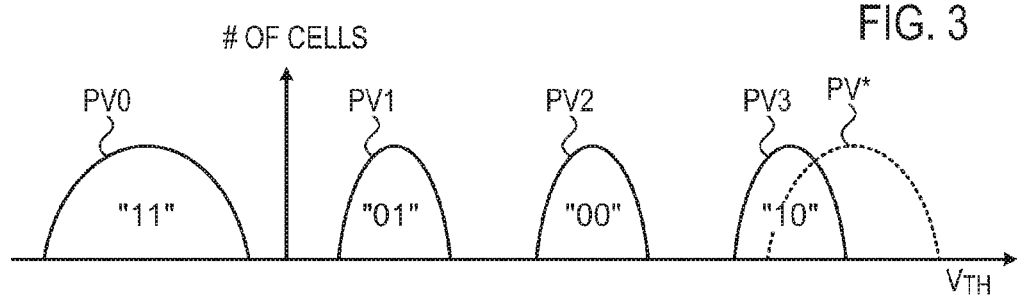

FIG. 3 is a graph that schematically illustrates threshold voltage distributions in a group of memory cells 32, including programming state PV*, in accordance with an embodiment. In this embodiment, whenever a group of memory cells is to be retained in an erased state, system 20 (typically R/W unit 36 under control of memory controller 40) sets the cells in the group to state PV*. When set to state PV* for long time periods, the memory cells reliability is retained (and possibly even improved).

As can be seen in the figure, programming state PV* corresponds to higher threshold voltages than the other programming states. This choice, although not mandatory, helps to minimize the reliability degradation because of the large threshold voltages of the cells. Alternatively, PV* can be configured to any other suitable voltage level or programming state.

State PV* can be used in various ways in the memory management of system 20. For example, in some embodiments, memory controller 40 and memory device 24 support two types of erase commands:

"Erase for retention"—A command that sets an entire block 34 to state PV*.

"Erase for programming"—A command that sets an entire block 34 to state PV0.

In an example flow, memory controller 40 erases memory blocks 34 whose data has become invalid, and makes them available for new programming. In an embodiment, when a block 34 is to be erased, the memory controller applies the "Erase for retention" command, which causes R/W unit 36 to set all the memory cells in that block to PV*. Only immediately before the memory controller is to program new data to the erased block, the memory controller applies the "Erase for programming" command.

In some embodiments, the Flash Translation Layer (FTL), or Flash management layer, in memory controller 40 programs memory cells to state PV* as part of its management operations. For example, in some embodiments the memory controller applies a block compaction process, also referred to as "garbage collection." In this process, the memory controller copies valid data from partially-valid source blocks into one or more destination blocks. After the valid data has been copied from a certain source block, the memory controller erases the source block using the "Erase for retention" command. Thus, the memory controller maintains a pool of memory blocks 34 that are all set to the PV* state. When new data is to be programmed, a block from this pool is erased using the "Erase for programming" command.

(In a variation of the above technique, instead of programming the memory block in question to PV*, the memory controller leaves the block programmed with the previous (but now invalid) data, and erases it only immediately before programming new data to the block. In cases in which the block stores secured or sensitive data, the memory controller can program to PV* only parts of the block (or of other blocks), so that the secret data in the block becomes un-decodable. Alternatively or additionally, the memory controller can replace the secret data with random data. These variations are applicable to any of the techniques described herein that use PV*.)

The above scheme, however, may increase programming time, because of the time overhead needed for performing the "Erase for programming" command. Therefore, in some embodiments the memory controller maintains one or more blocks 34 in state PV0 at any given time. These blocks are ready for immediate programming. The remaining blocks in the pool are set to PV*. The memory controller may replace a "PV0" block with another block from the "PV*" pool, e.g., if the "PV0" block has been waiting for programming for longer than a predefined time.

In some embodiments, the memory controller alternates the assignment of blocks that will be set to PV0, in order to balance the cell wear-out over the entire memory. In other words, the memory controller avoids scenarios in which the same blocks will be repeatedly assigned to the pool of PV0 blocks (and will thus wear-out more quickly than other blocks). Alternatively, the memory controller may retire the "PV0" blocks earlier than the other blocks.

Figure 4A:
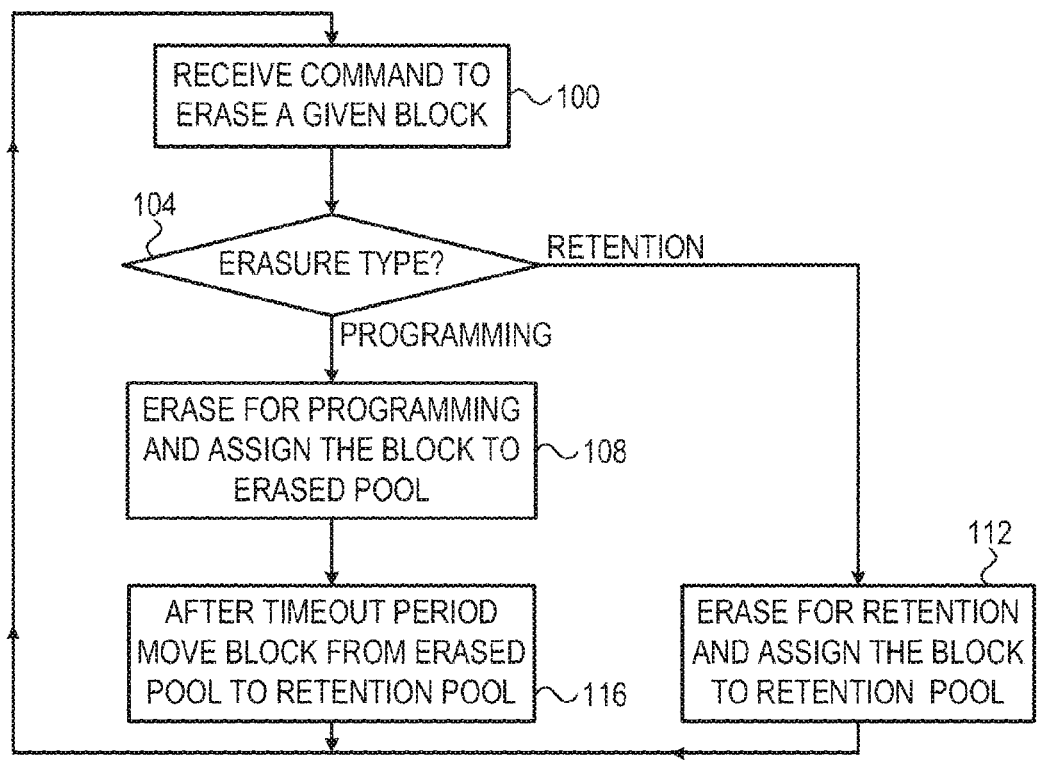
FIGS. 4A and 4B are flow charts that schematically illustrate methods for managing pools of retained and erased blocks, in accordance with an embodiment.
Figure 4B:
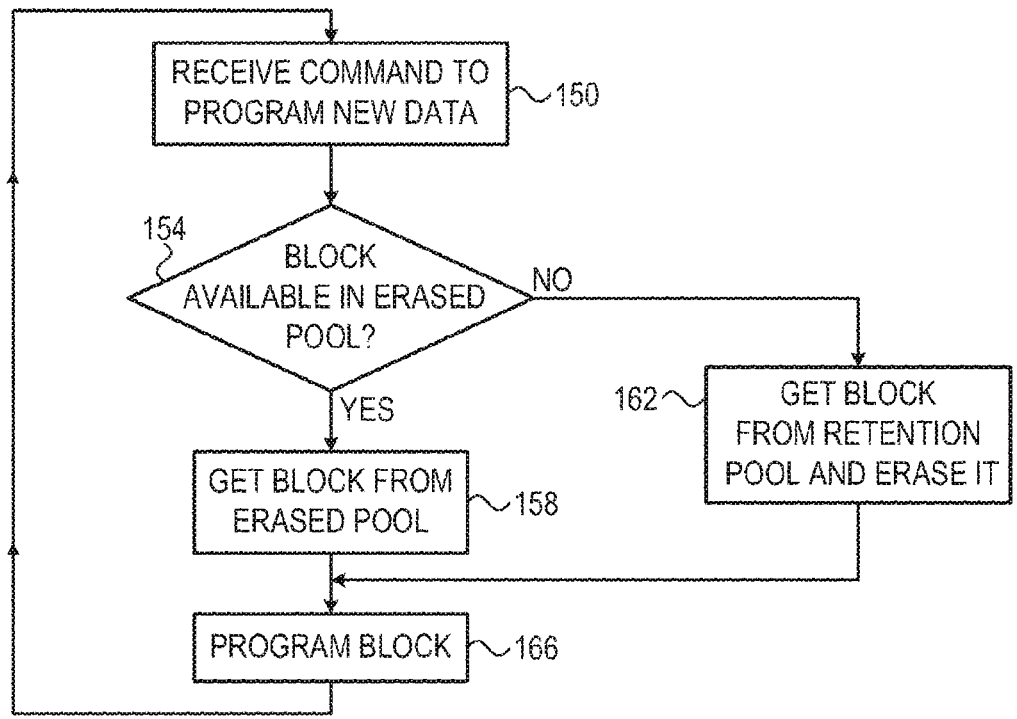

FIGS. 4A and 4B are flow charts that schematically illustrate methods for managing pools of retained and erased blocks, in accordance with an embodiment. The methods of FIGS. 4A and 4B can be implemented as part of a garbage collection procedure carried out by the memory controller. Erased blocks (i.e., blocks whose cells are erased by programming them to state PV0) are assigned to a pool of blocks that is referred to herein as an erased pool, whereas blocks whose cells are programmed to PV* are assigned to a pool that is referred to herein as a retention pool. Unlike the retention pool, the erased pool comprises blocks that are ready for immediate programming. The retention pool, on the other hand, comprises blocks that are typically less susceptible to reliability degradation over time, but should be erased prior to programming.

The method of FIG. 4A begins with memory controller 40 receiving a command to erase a given memory block, at an erasure command input step 100. At an erasure type checking step 104, memory controller 40 checks whether the block is to be erased for programming, or for long retention. Memory controller 40 can use any suitable method to select or determine the erasure type. For example, in some embodiments the erasure type is embedded in the erasure command received at step 100 above. Alternatively, the memory controller can decide on the erasure type based on the balance (e.g., measured by block count in each pool) between the erased and retention pools.

If at step 104 the block is destined for programming, memory controller 40 proceeds to an erase for programming step 108. At step 108 the memory controller erases the given block and assigns it to the pool of erased blocks. Otherwise, the given block is to retained for a long time period and the memory controller programs all the cells of the block to state PV* at a retention state programming step 112.

At an erased block identification step 116, memory controller 40 searches the erased pool for blocks that have put in the erased pool for longer than a predefined timeout period. Such blocks are then programmed to state PV* and assigned to the retention pool of blocks. Following step 112 or 116 above, the memory controller loops back to step 100 to receive a subsequent erasing command.

The erasure method of FIG. 4A is shown purely by way of example. In an alternative embodiment, any block destined for erasure is first erased for retention and assigned to the retention pool of blocks. In a background task, controller 40 maintains an appropriate number of blocks in the erased pool. For example, whenever the number of blocks in the erased pool falls below some predefined number, the controller adds a block to the erased pool (either a new block to be erased or a block from the retention pool.)

The method of FIG. 4B begins with memory controller 40 receiving a command to program new data at a program command input step 150. At a pool checking step 154, the memory controller checks whether there is an available block in the erased pool. If memory controller 40 identifies an available erased block at step 154, the memory controller gets an access to that block at a block accessing step 158. Otherwise, memory controller 40 selects a block from the retention pool and erases the selected block (i.e., to state PV0), at a retention setting step 162.

Following step 158 or 162, memory controller 40 has access to an erased block, and programs the erased block with the new data (received at step 150). The memory controller then loops back to step 150 to receive another programming command.

The management schemes described above are chosen purely by way of example. In alternative embodiments, system 20 may use state PV* in any other suitable way.

In the description above, the memory controller retains the memory cells in state PV* that is different from programming states PV0 . . . PV3. In alternative embodiments, the memory controller may retain memory blocks in one of the nominal programming states (e.g., the highest state PV3) instead of PV*. This scheme, too, reduced reliability degradation and can be implemented without any modification on the memory device side.

Delivery of Memory Devices with Programmed Memory Cells, Following Manufacturing and Production Tests Another scenario that involves considerable retention periods is delivery of memory devices from the factory, following production tests. Therefore, in some embodiments the memory devices are delivered from the factory with their memory cells set to state PV*. Using this technique, the memory cells are set to PV* during the long retention period from the factory until they are first programmed with user data. As a result, reliability degradation is reduced.

This technique is typically implemented as an additional programming operation (to PV*) in the final production test sequence. Note that this programming (to PV*) is different from other programming operations (with data) that may be applied during production testing of the memory device. Alternatively, it is possible to deliver memory device from production with their cells programmed with data (e.g., to the highest programming state).

Figure 5:
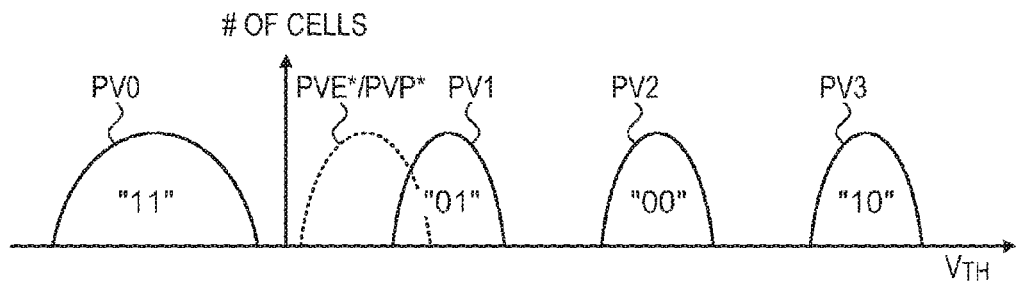
FIG. 5 is a graph that schematically illustrates threshold voltage distributions in a group of memory cells, in accordance with another embodiment.

Techniques for Mitigating Reliability Degradation Using Preliminary Programming FIG. 5 is a graph that schematically illustrates threshold voltage distributions in a group of memory cells 32, including programming states PVE* and PVP*, in accordance with an embodiment. In this embodiment, whenever a group of memory cells is to be erased or programmed, system 20 (typically R/W unit 36 under control of memory controller 40) sets the cells in the group to a respective state PVE* or PVP*, and only then applies a respective conventional erase or program operation. By initially programming the cells to state PVE* or PVP*, the reliability of the memory cells is retained (and possibly even improved).

In the example of FIG. 5, states PVE* and PVP* are positioned below PV1, so as to enable subsequent programming to any desired programming level. This choice, however, is not mandatory, and states PVE* and PVP* may be configured to other suitable settings as described below. Although FIG. 5 shows overlapping distributions for PVE* and PVP*, the two states may have two separate distributions.

States PVE* and PVP* can be used in various ways in the memory management of system 20. For example, in some embodiments, system 20 supports extended versions of the conventional erasure and/or programming commands. The extended operations may be carried out by R/W unit 36 under control of memory controller 40. In the extended erasure command, when erasing a memory block 34, the entire block is initially programmed to state PVE*, and then, as in the conventional erasure command, to state PV0. The transition from state PVE* to PV0 may be delayed using a configurable duration. In some embodiments, PVE* is configured to a positive level, typically lower than PV1. In such embodiments, it may be sufficient to verify that all the block cells have reached a threshold voltage above 0V before proceeding to the conventional erasure phase. Alternatively, state PVE* can be configured to a negative level, or to any other suitable level.

In the extended programming command, when programming new data to a group of (initially erased) memory cells 32, cells in the group that should not be kept at PV0 (i.e., are to be programmed to one of the states PV1 . . . PV3) are initially set to state PVP* and then to one of the states PV1 . . . PV3 according to the content of the new data to be programmed. Cells programmed to PVP* may be held in this state for a configurable duration before programmed with the new data. When programming a LSB page, the entire page (excluding cells that should be kept at PV0) is initially set to PVP*. When programming a MSB (or a higher significant bit) page, only cells that are in the erased state (i.e., PV0) and should be programmed to one of the states PV1 . . . PV3 are initially set to PVP*. In some embodiments, PVP* is configured to a level lower than PV1.

In the embodiments described above, each of the extended erasure or programming commands comprises two phases, i.e., an initial or preliminary phase in which cells are programmed to PVE* (or PVP*) and a subsequent phase in which conventional erasure (or programming) operation is carried out. In alternative embodiments, the initial phase is carried out using a separate command.

In some embodiments, the preliminary phase of programming to level PVE* or PVP* may be terminated even if some of the programmed cells have yet failed to reach the desired level after a certain time-out.

Techniques for Mitigating Reliability Degradation by Applying Dummy E/P Cycles

In various embodiments that are described herein, system 20 employs different techniques for mitigating the above-described degradation in memory cell reliability. In an embodiment, when new data is programmed to a memory block, in which at least part of the memory cells have been retained in the erased state for a prolonged time period, system 20 (typically R/W unit 36 under control of memory controller 40) performs a preliminary storage operation by applying a sequence of one or more dummy Erasure and Programming (E/P) cycles to the memory cells of the block.

In the context of the present patent application and in the claims, the term "dummy" refers to using non-user data in the programming phase of the E/P cycle. Following the application of the dummy E/P cycles, the actual new data is programmed to the memory cells of the block using any suitable programming method as known in the art.

System 20 can use any suitable method for applying the dummy E/P cycles. For example, at the programming phase of the E/P cycle, the memory cells can be programmed to one or more of the nominal PV0 . . . PV3 states or levels (e.g., using randomly selected levels), or to any other suitable combination of nominal and/or non-nominal programming levels. As another example, the transitions between the programming and erasure phases of the E/P cycle can be immediate, or otherwise configured to a predefined delay in each direction.

The number of dummy E/P cycles applied may be configurable and may depend on the duration of retention in the erased state. In some embodiments, even a single E/P cycle is sufficient.

Typically, there is no need for high accuracy in programming the memory cells during the dummy E/P cycles. Therefore, it is possible to program the memory cells using coarse (and therefore fast) programming. For example, the R/W unit may carry out the dummy E/P cycles without verification (e.g., using a single programming pulse), or with large-pulse and coarse programming and verification. As a result, a dummy E/P cycle is typically faster than a normal E/P cycle.

We now describe several examples in which preliminary application of the dummy E/P cycles can be used, in accordance with various embodiments. Assume, for example, that system 20 is required to store new data in a memory block 34 that was erased a long time ago. For example, the situation could occur in the first programming operation to a group of cells in the block in question after production. In order to improve the storage reliability of the memory cells in that group, a preliminary sequence of one or more dummy E/P cycles should be applied to these memory cells prior to programming the new data.

As another example, assume that new data is to be added to a memory block that has been retained partially programmed for a long period of time. Such a situation may occur, for example, when new data is added to a storage device that is re-used after the device has been switched off for a long duration. In an embodiment, any valid data that was previously stored in the memory block is initially copied to an alternative location, e.g., in another memory block, and a suitable number of dummy E/P cycles is applied to the memory block. Then, the new data is programmed to the memory block, possibly in addition to the data that was saved in the other block. It is also possible to leave the copied data stored in the alternative location.

As yet another example in which applying dummy E/P cycles can improve memory cells reliability, consider again a memory block 34 that has been retained partially programmed for a long period of time. In contrast to the previous example, however, in the present example any data previously programmed to that block is obsolete and may be discarded. Such a situation may occur, for example, when all the existing data in the block comprises old replicas of data items whose valid versions are stored in other blocks. Another such example occurs when the last programming operation to the memory block was not completed (e.g., due to programming failure or any other reason) and currently, after long time has elapsed, new data is programmed to that block. In an embodiment, a sequence of dummy E/P cycles is initially applied to the memory block, and then the new data is conventionally programmed.

Figure 6:
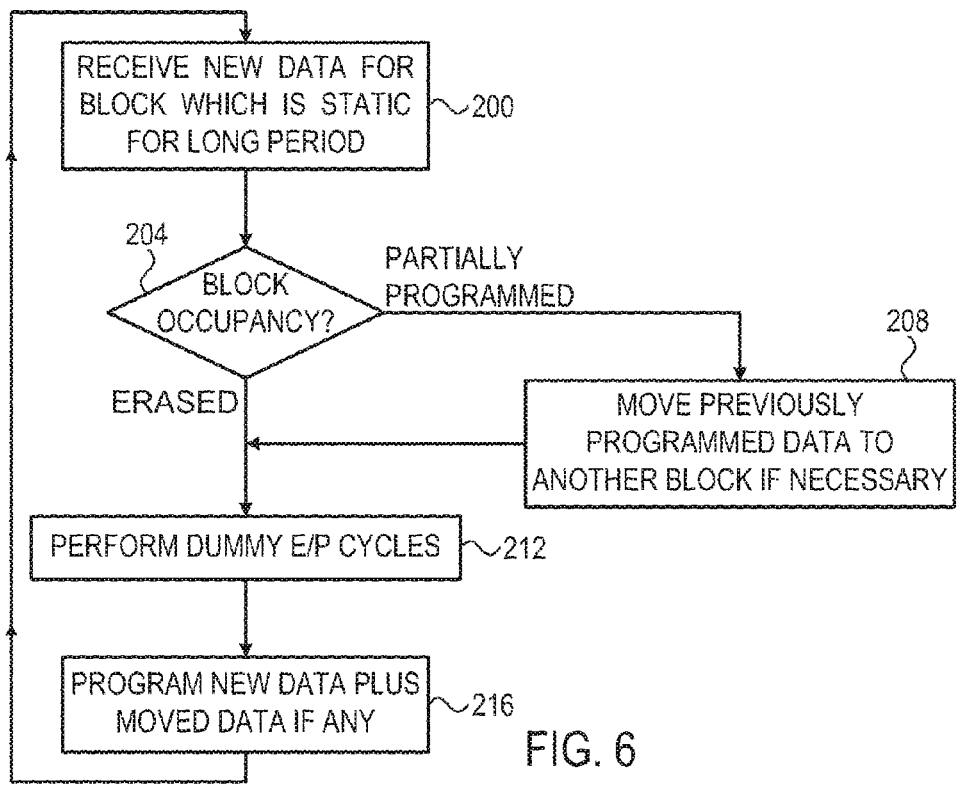
FIG. 6 is a flow chart that schematically illustrates a method for programming data to a memory block that has been static for a long time period, in accordance with an embodiment.

FIG. 6 is a flow chart that schematically illustrates a method for programming data to a memory block that has been static for a long time period, in accordance with an embodiment. The method starts with memory controller 40 receiving new data to be programmed, at a receiving step 200. The data received at step 200 is designated for a memory block that has been static for a long time period. In other words, the block was erased and/or partially programmed a long time ago, and therefore comprises a group of memory cells (e.g., at least one page of cells) that has been retained in the erased state for a long time period.

At an occupancy checking step 204, memory controller checks whether the block is erased or partially programmed. If at step 204 the memory controller detects that the block is partially programmed, the memory controller copies any previously programmed data from the memory block to another block, at a data saving step 208. Saving previously programmed data at step 208 is skipped if that data is obsolete and can be discarded.

Following step 208, or 204 when the block is found to be erased, the memory controller proceeds to a dummy E/P cycles application step 212, in which the controller performs a sequence of one or more dummy E/P cycles to the memory block. Then, at a programming step 216, memory controller 40 programs the newly received data (at step 200) to the memory block. If at step 208 previously programmed data was saved, the saved data is programmed to the memory block as well. Next, the method loops back to step 200 to accept subsequent data.

Scrambling Schemes for Increasing Average $V_{TH}$ During Long Retention Periods In some embodiments, instead of applying one or more of the above described techniques, e.g., using the dedicated state PV* to replace conventional erasing to state PV0, the memory controller uses a scrambling scheme that causes more cells to be programmed to high threshold voltages. Typically, this scrambling scheme is used during normal data storage operations, such that data is stored in the memory using a non-uniform distribution of data values to programming states. In this technique, the number of memory cells programmed to the high programming states (e.g., PV3) is larger than the number of memory cells programmed to the lower programming states.

Figure 7:
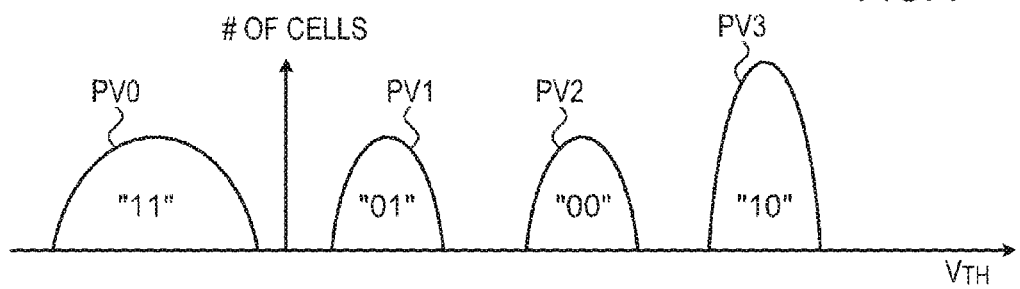
FIG. 7 is a graph that schematically illustrates threshold voltage distributions in a group of memory cells, in accordance with an alternative embodiment.

FIG. 7 is a graph that schematically illustrates threshold voltage distributions in a group of memory cells 32, in accordance with an alternative embodiment. In the present example the memory controller programs the memory cells using a scrambling scheme that causes non-uniform distribution of the memory cells among programming states PV0 . . . PV3. As can be seen in the figure, the scrambling scheme causes a large number of memory cells (a portion of the cells that is much larger than 25% as expected in uniform distribution) to be programmed to state PV3. A memory programmed in this manner will suffer little reliability degradation over long retention periods. In alternative embodiments, when storing data using a predefined set of programming levels, the non-uniform scrambling scheme generally causes higher programming levels to be programmed to a larger portion of the memory cells among all the programming levels in the predefined set.

In some embodiments, memory controller 40 achieves such non-uniform scrambling at the expense of some ECC redundancy.

Selective Activation of Degradation Mitigation Techniques

Typically, the reliability degradation effect described above becomes more severe as the cell wear level increases, e.g., after a large number of programming and erasure cycles. Thus, in some embodiments system 20 activates the mitigation techniques described above only after the memory cells have reached a certain wear level.

For example, the memory controller may use conventional erasure (i.e., to level PV0) up to a certain number of programming and erasure cycles, e.g., at the start of life of the memory. After a certain number of cycles, e.g., toward end-of-life, the memory controller may start applying one or more (e.g., in parallel) of the mitigation techniques described above. For example, the memory controller may start applying the "Erase for retention"/"Erase for programming" scheme and/or the dummy E/P cycles described above.

The methods described above are exemplary methods, and any other suitable methods can be used in alternative embodiments. For example, although the embodiments described above refer mainly to 2 bits/cell memory cells that are programmed using four programming levels, the disclosed techniques are also applicable to any other suitable memory cells, such as memory cells whose capacity is 3 bits/cell using eight programming levels, as well as memory cells that may store a fractional number of bits per cell using a number of programming levels that is not a power of 2.

In the embodiments described above, since programming to each of the dedicated states PV*, PVE* or PVP*, does not involve data readout, it is possible to set the memory cells to these states using coarse (and therefore fast) programming. For example, the R/W unit may program memory cells to each of the states PV*, PVE*, or PVP*, without verification (e.g., using a single programming pulse), or with large-pulse and coarse programming and verification. As a result, the threshold voltage distribution of states PV*, PVE*, and PVP*, will typically be wide.

In alternative embodiments, the R/W unit programs an entire block to PV*, PVE*, or PVP*, simultaneously (i.e., not one word line at a time), by applying one or more programming pulses concurrently to multiple word lines. Further alternatively, the R/W unit may program more than a single block simultaneously. The latter technique is particularly suitable for three-dimensional memory configurations, but is also applicable in two-dimensional memories. This sort of simultaneous programming is also applicable to other storage operations that do not depend on user data such as the dummy E/P cycles described above.

In some embodiments, when setting cells to state PVP*, or PVE*, or when performing the dummy E/P cycles, it is possible to approach or possibly exceed the pass voltage ($V_{PASS}$) defined for the memory cells, because over-programming is usually not problematic in erased blocks. Nevertheless, the threshold voltages of state PV*, PVE*, or PVP*, should not reach high values that possibly cause damage to the cell media. Generally, any suitable range of threshold voltages can be used for state PV*, PVE*, and PVP*.

It will be appreciated that the embodiments described above are cited by way of example, and that the present disclosure is not limited to what has been particularly shown and described hereinabove. Rather, the scope of the disclosed embodiments includes both combinations and subcombinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
   a plurality of blocks, wherein each block includes multiple memory cells;
   circuitry configured to:
   receive data for storage in a first block of the plurality of blocks;
   perform one or more dummy program erase cycles on the memory cells included in the first block in response to a determination that a first elapsed time since an erase operation was performed on the first block is greater than a first threshold time; and
   program the memory cells included in the first block using the received data in response to a completion of the one or more dummy program erase cycles.

2. The apparatus of claim 1, wherein the circuitry is further configured to copy previously programmed data from the first block to a second block of the plurality of blocks in response to a determination that the first block includes one or more programmed memory cells.

3. The apparatus of claim 2, wherein to program the memory cells included in the first block, the circuitry is further configured to retrieve the previously programmed data from the second block and program the memory cells included in the first block using the retrieved previously programmed data.

4. The apparatus of claim 1, wherein the circuitry is further configured to perform the one or more dummy program erase cycles on the memory cells included in the first block in response to a determination that a second elapsed time since the first block was partially programmed is greater than a second time threshold.

5. The apparatus of claim 1, wherein the circuitry is further configured to perform the one or more dummy program erase cycles on the memory cells included in the first block in response to a determination that a number of erased memory cells included in the first block is greater than a threshold value.

6. The apparatus of claim 1, wherein to perform the one or more dummy program erase cycles on the memory cells included in the first block, the circuitry is further configured to program at least some of the memory cells included in the first block with non-user data.

7. A method, comprising:
receiving data for storage in a first block of a plurality of blocks included in a memory,
wherein each block includes multiple memory cells;
performing one or more dummy program erase cycles on the memory cells included in the first block in response to determining that a first elapsed time since an erase operation was performed on the first block is greater than a first threshold time; and
programming the memory cells included in the first block using the received data in response to completing the one or more dummy program erase cycles.

8. The method of claim 7, further comprising copying previously programmed data from the first block to a second block of the plurality of blocks in response to determining that the first block includes one or more programmed memory cells.

9. The method of claim 8, wherein programming the memory cells included in the first block includes retrieving the previously programmed data from the second block and programming the memory cells included in the first block using the retrieved previously programmed data.

10. The method of claim 7, further comprising performing the one or more dummy program erase cycles on the memory cells included in the first block in response to determining that a second elapsed time since the first block was partially programmed is greater than a second time threshold.

11. The method of claim 7, further comprising performing the one or more dummy program erase cycles on the memory cells included in the first block in response to determining that a number of erased memory cells included in the first block is greater than a threshold value.

12. The method of claim 7, wherein performing the one or more dummy program erase cycles on the memory cells included in the first block includes programming at least some of the memory cells included in the first block with non-user data.

13. The method of claim 7, wherein each memory cell of the multiple memory cells includes a non-volatile memory cell.

14. A system, comprising:
a memory including a plurality of blocks, wherein each block includes a plurality of memory cells; and
a memory controller coupled to the memory, wherein the memory controller is configured to:
receive data, from a host, for storage in a first block of the plurality of blocks;
perform one or more dummy program erase cycles on the memory cells included in the first block in response to a determination that a first elapsed time since an erase operation was performed on the first block is greater than a first threshold time; and
program the memory cells included in the first block using the received data in response to a completion of the one or more dummy program erase cycles.

15. The system of claim 14, wherein the memory controller is further configured to copy previously programmed data from the first block to a second block of the plurality of blocks in response to a determination that the first block includes one or more programmed memory cells.

16. The system of claim 15, wherein to program the memory cells included in the first block, the memory controller is further configured to retrieve the previously programmed data from the second block and program the memory cells included in the first block using the retrieved previously programmed data.

17. The system of claim 14, wherein the memory controller is further configured to perform the one or more dummy program erase cycles on the memory cells included in the first block in response to a determination that a second elapsed time since the first block was partially programmed is greater than a second time threshold.

18. The system of claim 14, wherein the memory controller is further configured to perform the one or more dummy program erase cycles on the memory cells included in the first block in response to a determination that a number of erased memory cells included in the first block is greater than a threshold value.

19. The system of claim 14, wherein to perform the one or more dummy program erase cycles on the memory cells included in the first block, the memory controller is further configured to program at least some of the memory cells included in the first block with non-user data.

20. The system of claim 14, wherein each memory cell of the plurality of memory cells includes a non-volatile memory cell.

* * * * *